(12) United States Patent
Craig et al.

(10) Patent No.: US 6,971,163 B1
(45) Date of Patent: Dec. 6, 2005

(54) ADHESIVE AND ENCAPSULATING MATERIAL WITH FLUXING PROPERTIES

(75) Inventors: Hugh Patrick Craig, Gwent (GB); David John James Lowrie, Lincoln (GB)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/673,992

(22) PCT Filed: Apr. 22, 1999

(86) PCT No.: PCT/GB99/01236

§ 371 (c)(1),
(2), (4) Date: Jan. 16, 2001

(87) PCT Pub. No.: WO99/54372

PCT Pub. Date: Oct. 28, 1999

(30) Foreign Application Priority Data

Apr. 22, 1998 (GB) .................................... 9808587
Sep. 29, 1998 (GB) .................................... 9821162

(51) Int. Cl.[7] .............................................. H05K 3/34
(52) U.S. Cl. ...................... 29/840; 428/413; 428/418; 252/510; 252/512
(58) Field of Search ..................... 29/840; 428/413, 428/418, 414, 416; 252/510, 511, 512

(56) References Cited

U.S. PATENT DOCUMENTS

| 4,396,666 | A | * | 8/1983 | Ernsberger ................. 428/208 |
|---|---|---|---|---|
| 5,268,255 | A | * | 12/1993 | Kikuchi et al. .......... 430/280.1 |
| 5,376,403 | A | * | 12/1994 | Capote et al. ................ 427/96 |
| 5,604,274 | A | * | 2/1997 | Gallagher et al. ............ 524/69 |
| 5,677,367 | A | * | 10/1997 | Savin ......................... 523/219 |
| 5,770,347 | A | * | 6/1998 | Saitoh et al. ............ 430/280.1 |
| 5,776,796 | A | * | 7/1998 | Distefano et al. ........... 438/106 |
| 5,804,610 | A | * | 9/1998 | Hamer et al. ............... 522/182 |
| 5,830,389 | A | * | 11/1998 | Capote et al. .............. 252/512 |
| 5,948,533 | A | * | 9/1999 | Gallagher et al. .......... 428/418 |
| 5,985,043 | A | * | 11/1999 | Zhou et al. ............. 252/512 X |
| 6,017,634 | A | * | 1/2000 | Capote et al. .............. 428/414 |
| 6,096,245 | A | * | 8/2000 | Tanigaki et al. ............ 252/512 |
| 6,123,799 | A | | 9/2000 | Ohura et al. |
| 6,132,646 | A | * | 10/2000 | Zhou et al. ................. 252/512 |
| 6,147,141 | A | * | 11/2000 | Iyer et al. |
| 6,344,157 | B1 | * | 2/2002 | Cheng et al. ............... 252/512 |
| 6,402,013 | B2 | * | 6/2002 | Abe et al. ................... 228/223 |
| 6,528,169 | B2 | * | 3/2003 | Charles et al. ............. 428/414 |
| 6,583,201 | B2 | * | 6/2003 | Cheng et al. ............... 523/457 |
| 6,692,793 | B2 | * | 2/2004 | Sato et al. .................. 427/510 |

\* cited by examiner

*Primary Examiner*—Ljiljana Ciric
(74) *Attorney, Agent, or Firm*—Sharon K. Brady

(57) ABSTRACT

The attachment of an electrical component to an electrical termination on a component-carrying substrate by a solder bump technique of a thermally curable adhesive composition for encapsulating purposes is described which comprises a thermosetting polymer and a chemical cross-linking agent which has fluxing properties but which is unreactive or of severely restricted reactivity with the polymer without the action of heat and/or catalyst. The composition is to be thermally curable when heated to soldering temperatures in a reaction which is catalyzable merely by metal oxide fluxed from metal surfaces by cross-linking agent then dissolved in the thermosetting polymer.

12 Claims, No Drawings

ADHESIVE AND ENCAPSULATING MATERIAL WITH FLUXING PROPERTIES

This invention relates to electrical interconnection methods in electronic circuitry and more particularly to flip chip attachment and encapsulation of both naked semi-conductors and chip scale packages (CSPs). The technology is commonly referred to as underfill technology.

As is noted in U.S. Pat. No. 5,128,746, solder bump interconnections when attaching chips to electronic circuitry eliminate the expense, performance limitations, low productivity and poor space utilisation of wire bonding. As circuit density increases occur, while circuit board and assembly sizes continue to shrink, so-called flip-chip interconnection using solder bumps has proved to be the most suitable technique for satisfying such demands.

With the most common form of flip-chip interconnection, solder bumps are placed on terminals of the integrated circuit being produced while the substrate for the integrated circuit is still in the form of a small wafer or die. Commonly, the eutectic Sn/Pb 60/40 or a high melting point alloy such as Sn/Pb 3/97, which is known to have been employed in the IBM C4 process, is employed as solder material. The die or wafer carrying the integrated circuit is to be joined to a substrate and for this purpose the die or wafer will be inverted (hence the term flip-chip). It is current manufacturing practice to place a flux or solder paste on the substrate. This material will promote the adhesion of the die to the substrate during reflow of the solder bump. During reflow, the assembly produced is subjected to a temperature sufficient to melt or collapse (C4 process) the solder bump and form the required interconnections. The flux residue must then be removed to prevent corrosion occurring to the die and, importantly, to allow free ingress of a subsequent underfill resin which is to encapsulate the various semi-conductors of the electronic circuitry produced.

For this latter purpose, an underfill encapsulant resin is applied around and under the die following reflow and flux removal. The very small gap between the die and substrate must be completely filled in order to provide environmental protection for the device. The filling of this gap is dependent on capillary action of the encapsulant material between the integrated circuit and substrate. The filling of is the gap has proved to be a procedure which is very time consuming, expensive and difficult to achieve in the desired quality and is generally an unreliable procedure, particularly when a relatively large die is used. Moreover, the low viscosity of encapsulant material needed to ensure capillary action runs counter to the need to control thermal expansion and thermal conductivity by filling the encapsulation resin with ceramic powder which generally increases the viscosity of the resin. A solution to this problem has been to heat the substrate/component assembly to reduce initially the viscosity of the underfilling encapsulant resin. Temperatures must be precisely controlled and the process is difficult to control since the elevated temperature triggers the curing mechanism thus raising viscosity prematurely. For these various reasons, the underfilling process currently employed has low productivity and high space/equipment needs.

In the aforementioned U.S. Pat. No. 5,128,746, it is proposed to add a fluxing agent to a cross-linking agent-containing encapsulant resin, the encapsulant resin being dispensed onto the substrate before the integrated circuit-carrying chip is placed in the encapsulant resin for reflow. U.S. Pat. No. 5,128,746 discloses the use of certain strong organic dicarboxylic acids as examples of commercially available fluxing agents. A fluxing encapsulant resin of such type has three very serious drawbacks which compromise the integrity of the interconnection. Free acid remains in the encapsulant after reflow and can and will attack and corrode metal present, especially on the die or wafer. This problem is exacerbated by the decreased environmental resistance of such adhesive composition due to the presence of unreacted resin. As the adhesive composition has relatively low resistance to humidity and moisture, the corrosion problem is thus intensified. Moreover, the addition of acids of the stated type to epoxy resin adhesives compromises the stability of the adhesive, greatly reducing pot life and making cure characteristics variable. This will have a major effect on reliability and process control.

Finally, it is known that salts formed during fluxing of materials by reaction between metal oxides and fluxing agent and containing various metals including tin and lead can have a catalytic action on polymer materials thus causing a premature cure of the polymer prior to reflow of the solder.

It is an object of this invention to provide for the use of a thoroughly curable adhesive which does not suffer the problem of unreacted acid remaining in the encapsulant after reflow or the problem of pre-cure of the polymer due to salts formed during fluxing.

In one aspect, this invention provides a thermally curable adhesive composition which comprises:

(a) a thermosetting polymer, or a monomer which is polymerisable to yield a thermosetting polymer, said polymer being crosslinkable when subject to the action of a chemical crosslinking agent; and (b) a chemical crosslinking agent for said polymer, the crosslinking agent having fluxing properties and exhibiting no reactivity, or exhibiting very restricted reactivity with the polymer without the action of a catalyst and/or heat; and which composition is thermally curable when heated to temperature range extending from the liquidus temperature of the alloy Sn/Pb 60/40 up to the liquidus temperature of the alloy Sn/Pb 3/97 and in the presence of a catalyst for the crosslinking of the polymer with a crosslinking agent and is storage and reaction stable in the absence of such catalyst and at temperatures in the range of from 20–25° C.

According to a second aspect of the present invention there is provided a method of producing an electronic device which comprises opposing an electrical component having a surface carrying a plurality of electrical terminations, each termination including a solder bump, and a component-carrying substrate having a plurality of electrical terminations corresponding to the terminations of the electrical component, with a thermally curable adhesive composition being applied to said surface of the electrical component and/or to the substrate, bringing the electrical component and substrate into contact at elevated temperature and thereby soldering the electrical component to the substrate and simultaneously achieving encapsulation thereof in thermoset polymer produced in situ from monomer or polymer in the adhesive composition, in which method (1) the thermally curable adhesive composition comprises:

(a) a thermosetting polymer, or a monomer which is polymerisable to yield a thermosetting polymer, said polymer being crosslinkable when subject to the action of a chemical crosslinking agent; and (b) a chemical crosslinking agent for said polymer, the crosslinking agent having fluxing properties and exhibiting no reactivity, or exhibiting very restricted reactivity with the polymer without the action of a catalyst and/or heat; and which composition is thermally curable when the material of the solder bump is molten and in the presence of a catalyst for the crosslinking of the polymer with the crosslinking agent and is storage and reaction stable in the absence of such catalyst and at temperatures in the range of 20–25° C. and (2) catalysis of crosslinking of the thermally curable adhesive is achieved by metal oxide removed from metal surfaces by the fluxing composition and/or salts formed by reaction between metal oxide and crosslinking agent.

This method uses novel adhesive compositions which are preferably compositions of the first aspect of the present invention.

A crosslinking agent to be employed in the practice of the present invention will have fluxing properties so as to enable it to remove oxides from the material with which it is in contact, i.e. die and substrate metallisation and, more particularly, solder metal, thereby allowing solder joint formation. The crosslinking agent, when present in sufficient amount, is to be capable of complete reaction with thermosetting polymer to neutralise, i.e. react with all reaction sites of the polymer. The design of the adhesive is preferably intended to ensure absence of residual cross-linking agent therein and hence equimolar quantities of polymer and crosslinking agent are generally used. However, excess cross-linking agent is not a problem in the practice of this invention. Although it has the potential to corrode metal surfaces which are normally accessible via pinholes which are present unavoidably in resin, now any excess cross-linking agent remains trapped in the polymer matrix together with catalyst so that corrosion of metal is not a problem. The composition itself is storage and reaction stable until heated to a temperature at which the latent reaction catalyst effectively causes the crosslinking agent to cure the thermosetting polymer and at which temperature the crosslinking agent will have melted and dissolved in the polymer or monomer.

Thus, the present invention provides for the use of chip underfill and encapsulation adhesive compositions having fluxing properties which enable one to achieve overall a rugged structure with protection of integrated circuits which have been previously solder bumped and then flip chip connected to a substrate with a metallisation pattern. During reflow, the fluxing achieved with the crosslinking agent allows metallic interconnection to be achieved between solder bump and metallisation pads on the substrate. The adhesive composition then reacts and cures to provide a fully adhered encapsulate underfill that is non-corrosive and environmentally resistant. The adhesive compositions themselves are stable and provide a long storage life at ambient temperatures, that is 20–25° C., while maintaining predictable processing characteristics. The adhesive compositions lack the substantial debilitating defects in the hitherto known compositions by providing a means for predepositing the underfill and eliminating separate fluxing and cleaning. The adhesive composition may be modified to optimise CTE, glass transition temperature (Tg), elasticity modulus and thermal conductivity without detriment to the aforementioned benefits or detriment to the require rheological properties which allow for ease of deposition, for example by syringe dispensing. In addition, curing is achieved readily during any suitable thermal treatment, for example during reflow soldering. The underfill may only be partially cured after one or several solder reflow cycles, thus enabling ease of reworking of the device. Full cure is then achieved in a separate post-cure heat application. Alternatively, full cure may be obtained from one or two reflow cycles if reworkability is not required.

Insofar as the solder is concerned, this may consist of one or more metals which provide a suitable low melting point material. The metals employed are typically selected from tin, lead, bismuth, cadmium, zinc, gallium, indium, tellurium, mercury, thallium, antimony and selenium. The preferred such metal is tin or a tin/lead alloy. Specific examples of solders which may be employed are the aforementioned eutectic Sn/Pb 60/40 and the high melting point Sn/Pb 3/97.

The thermosetting polymer or monomer utilised in the compositions employed in the method of this invention is an adhesive substance which is preferably liquid at ambient temperature. Thus one may utilise a reactive polyester or an epoxide monomer or polymer such as an epoxy Novolak or epoxide precursor thereof. A preferred epoxy resin is either a diglycidyl ether of bisphenol A or a diglycidyl ether of bisphenol F. In preferred practice, such an epoxy resin is a B-stage resin or a resin which may be "B-staged" after application, thereby making it possible for there to be a delay before bringing together the component and the substrate. Other preferred epoxy materials to use are substances from the Araldite series of Ciba-Geigy Resins, such as the trifunctional epoxide MY10510 and the difunctional cycloaliphatic epoxide ERL 4221 which may be used singly or in admixture. The Araldite MY10510 may be replaced by Aradite MY9512, a tetra-functional epoxide-based resin. MY9512 may be used alone, too, as may the trifunctional epoxide-based resin MY10510. The composition of the invention may also contain a monomer precursor for a polymer, e.g an epoxide compound when an epoxy resin is required. Mixtures of such epoxy materials may also be used.

The crosslinking agent with fluxing properties is usually solid at ambient temperature, but, provided it meets the reactivity requirements set out above for crosslinking agents of adhesive composition to be used this invention, it can also be liquid at ambient temperatures. The crosslinking agent is preferably a di- or polycarboxyl compound which is unreactive at ambient temperature and insoluble in the monomer or polymer until heated, in practice generally to soldering temperatures, and such cross linking agents are generally referred to hereafter as polyacids. The cross-linking agent is preferably solid for this reason. Such polyacids serve as a fluxing agent for the oxide material present on the solder, which metal oxide is a catalyst for reaction between an epoxy resin and the carboxyl groups of the polymer at elevated temperatures. Such polyacid may be in particular a carboxylated polymer, a multifunctional polyanhydride or a long chain ($C_8$ or greater, preferably $C_{10}$ or greater) polycarboxylic acid, preferably dicarboxylic acid. These acidic reactive compounds having a functionality greater than 1 provide multiple reaction sites, with epoxy resin serving to create a macromolecule that provides adhesion. A particularly preferred example of a polymer containing two or more carboxyl groups which may be employed is a styrene-acrylic acid copolymer. A preferred dicarboxylic acid is dodecanedioic acid (DDDA).

The polyanhydrides which may be used as cross-linking agent with fluxing properties in the practice of this invention and which are preferably solid include polyazelaic polyanhydride and polyadipic polyanhydride. These materials provide stability when and mixed with epoxy resin and become active fluxing and curing agents only when heated to their melting points.

Other crosslinking agents with fluxing properties which can be used are mono, di- and polyhydrazides which are solid at ambient temperature and insoluble in the monomer or polymer until heated, in practice generally to soldering temperature. A preferred such compound is adipic dihydrazide. Because of the differing reactivities of polycarboxylic acids and hydrazides, it is preferred to use a mixture of crosslinking agents, such as dodecanedioic acid and adipic dihydrazide, the higher reactivity of the latter being countered by the lower reactivity of the former.

While the oxide removed from the solder or a salt produced by reaction between the polyacid and such oxide, as a result of the fluxing activity of the crosslinking agent, acts as a catalyst for the curing of the polymer, curing in the manner of a snap cure fix is achieved only when a catalyst is present, such catalyst being active at the elevated temperature utilised for soldering. A preferred such latent catalyst is an imidazole catalyst especially phenyl imidazole. This effect is often not desirable as it is contrary to the need to adjust positioning of components during soldering. Other latent reaction catalysts which can be used are tertiary amines with the amine groups optionally substituting the reactive monomer or polymer, as in the aforesaid Araldite MY10510 or MY9512, or metallic salts such as tin octanoate, dibutyl tin dilaurate, ferric acetylacetonate, and cobalt (III) acetylacetonate.

Preferred compositions will have a thermosetting polymer-crosslinking agent/flux content in which there are from 45 to 70%, more preferably 50 to 60%, by weight of thermosetting polymer and from 55 to 30% by weight, more preferably 50 to 40%, by weight crosslinking agent/flux.

The use in adhesive compositions employed for encapsulating flip chip connections of ceramic powders to enhance thermal expansion and modulus properties of the composition is preferably to be adopted in the practice of the present invention. It is preferred that such ceramic powders be highly thermally conductive to enhance the connection between solder bump and conductor on the substrate while ensuring that the compositions retain the low viscosity necessary for fluxing and for ease of deposition. The filler is preferably a nominally $5\mu$ diameter spherical ceramic bead or hollow sphere composition. More generally, it may be a glass or ceramic powder comprising spherical particles of $0.1-25\mu$, preferably $1-15\mu$, diameter or comprise essentially monodisperse spherical particles having a single diameter of $0.1-25\mu$, preferably $1-15\mu$. The ceramic powder has preferably a very high thermal conductivity. Examples of such ceramic powders which may be employed are $SiO_2$, $MgO$, $Al_2O_3$, $TiO_2/ZnO$, barium sulphate and diamond dust. In some cases, it is preferred that the ceramic powder utilised has instead a very low or negative coefficient of thermal expansion, too, and if this requirement is imposed on the ceramic powder then a preferred example is aluminium lithium silicate.

Metal oxides formed on solder metals even at ambient temperatures are themselves a problem since they can catalyse crosslinking of the thermosetting resin or its monomer precursor. In accordance with a preferred embodiment of the invention, the resin or precursor contains an acid flux which is liquid at temperatures below 100° C., preferably below 40° C., more preferably ambient temperature. This acid will react with oxides to form salts which will not decompose until at elevated temperatures, in particular soldering temperatures when the resulting oxides, together with oxides formed on the metal surfaces more readily at the higher temperatures and removed from the metal surfaces by the flux/crosslinking agent, will catalyse the crosslinking of the thermosetting polymer.

The term "acid" as such is used herein to denote the more volatile flux for preventing prepolymerisation/crosslinking and to distinguish it from the solid crosslinking agent/flux. The more volatile flux is generally liquid at ambient is temperature so that it acts immediately as a flux. It should certainly be liquid, at least at temperatures below those at which the crosslinking agents used become fully reactive in the presence of metal oxide/salt crosslinking catalysts. It is thus preferred that the acid used for preventing prepolymerisation, even if solid at ambient temperature, is liquid by 40° C.

Such liquid acids may be polyacids, but will normally be monocarboxylic acids. The acids preferably contain at least 8 carbon atoms and are exemplified by versatic acids, in particular versatic 10 which is a synthetic acid composed of a mixture of highly branched isomers of $C_{10}$ monocarboxylic acids, mainly of tertiary structure. The high degree of branching gives rise to steric hindrance which means that the salts formed are thoroughly stable and difficult to break down. Other acids which may be used are capric acid, caprylic lauric acid, stearic acid and palmitic acid.

When such monocarboxylic acids are to be used, compositions embodying the invention preferably will have a thermosetting polymer-flux content in which there are 30 to 70%, more preferably 50 to 60%, by weight of thermosetting polymer and from 70 to 30%, more preferably 50 to 40%, by weight of a mixture of fluxes, the flux components consisting of from 80 to 97%, preferably 85 to 95%, by weight of solid crosslinking agent/flux and from 20 to 3%, preferably 15 to 5%, by weight of acid flux which is liquid at below 100° C.

When practising the present invention, there is no need for the adhesive composition to be introduced subsequent to formation of a solder connection with the attendant difficulties identified above. It is possible for the composition to be predeposited, before emplacement and soldering of electronic component to substrate, on either or both of the electronic component and the substrate. As there is no need for a separate fluxing agent to be employed which is not incorporated in the adhesive composition, the presence of the composition on one or other of the electronic component and the substrate fulfils the required fluxing function. Insofar as the composition may be applied to the electronic component, then application may be to dies which are either in wafer form or as separate discrete devices. Application of the composition may be by screen printing, stencil printing, dispensing, spinning or any other known method for applying a composition to discrete areas.

The ease of working in accordance with the method of this invention enables the composition to contain the thermosetting resin in the form of a B-stageable precursor for application to die, substrate or carrier tape and then B-staging so as to form a handleable film which becomes fully crosslinked only when the soldering operation is carried out.

The following examples illustrate the adhesive compositions which may be used in the practice of this invention. In the examples all percentages are percentages by weight.

EXAMPLE 1

| | |
|---|---|
| ERL 4221 | 40.6% |
| MY9512 | 12.7% |
| DDDA | 46.7% |

This composition was functionally good and of satisfactory viscosity for most applications.

EXAMPLE 2

| ERL 4221 | 39.65% |
|---|---|
| Epoxy MY9512 | 12.40% |
| DDDA | 41.05% |
| Versatic 10 | 6.90% |

This composition was functionally good in not undergoing pre-crosslinking but had too low a viscosity for some applications. As a result, higher viscosity compositions as follows were made up and found to work well.

EXAMPLE 3

| ERL 4221 | 33.45% |
|---|---|
| MY9512 | 18.60% |
| DDDA | 41.05% |
| Versatic 10 | 6.90% |

EXAMPLE 4

| ERL 4221 | 26.05% |
|---|---|
| MY9512 | 26.00% |
| DDDA | 41.05% |
| Versatic 10 | 6.90% |

EXAMPLE 5

| ERL 4221 | 12.40% |
|---|---|
| MY9512 | 39.65% |
| DDDA | 41.05% |
| Versatic 10 | 6.90% |

The initial viscosity of the composition is here somewhat too high for ease of use. Moreover, while Examples 2 to 5 made use of monocarboxylic acids liquid at ambient temperature, it is also possible to use monocarboxylic acids solid at ambient temperature but liquid at temperatures below those at which the crosslinking agent/flux are, for example, as follows:—

EXAMPLE 6

| ERL 4221 | 39.65% | |
|---|---|---|
| Epoxy MY9512 | 12.40% | |
| DDDA | 41.05% | |
| Prifrac 2960 | 6.90% | (C16 Palmitic acid - solid melts at 60° C.) |

EXAMPLE 7

| ERL 4221 | 39.65% | |
|---|---|---|
| Epoxy MY9512 | 12.40% | |
| DDDA | 41.05% | |
| Versatic 10 | 6.90% | (C18 - melts at 69° C.) |

Finally compositions were formulated which contained lower amounts of monocarboxylic acid. These, too, proved to be satisfactory.

EXAMPLE 8

| ERL 4221 | 39.65% |
|---|---|
| MY9512 | 12.40% |
| DDDA | 44.95% |
| Versatic 10 | 3.00% |

EXAMPLE 9

| ERL 4221 | 42.62% |
|---|---|
| MY9512 | 13.33% |
| DDDA | 41.05% |
| Versatic 10 | 3.00% |

What is claimed is:
1. A thermally curable adhesive composition, comprising:
   (A) a compound selected from the group consisting of (i) a thermosetting polymer and (ii) a monomer which is polymerizable to yield a thermosetting polymer, wherein the thermosetting polymer (i) and the thermosetting polymer yielded by polymerization of the monomer (ii) are crosslinkable when subject to a chemical crosslinking agent; and
   (B) a chemical crosslinking agent selected from the group consisting of (i) polyacids, (ii) polyanhydrides, and (iii) hydrazides, wherein the crosslinking agent has fluxing properties, is a solid at ambient temperature and is insoluble in the thermally curable adhesive composition until heated to a soldering temperature; and wherein the composition is thermally curable when heated to the soldering temperatures.

2. The composition according to claim 1, wherein the polyacid is selected from the group consisting of polymers containing two or more carboxyl groups and di- and polycarboxylic acids.

3. The composition according to claim 2, wherein the polycarboxylic acid is a $C_8$ or greater dicarboxylic acid.

4. The composition according to claim 1, wherein the hydrazide is a monohydrazide or a dihydrazide or a polyfunctional hydrazide.

5. The composition according to claim 1, wherein the crosslinking agent contains a dihydrazide or a dicarboxylic acid or a mixture of a dihydrazide and a dicarboxylic acid.

6. The composition according to claim 5, wherein the crosslinking agent contains adipic dihydrazide or dodecanedioic acid or a mixture of adipic dihydrazide and dodecanedioic acid.

7. The composition according to claim 1, wherein the polyanhydride is either polyazelaic anhydride or polyadipic anhydride.

8. The composition according to claim 1, further comprising an acid flux which is liquid at temperatures below 100° C. and which fluxes metals so as to create metallic salt.

9. The composition according to claim 8, wherein the acid flux is liquid at temperatures from 20° C. to 25° C.

10. The composition according to claim 8, wherein the acid flux is a monocarboxylic acid.

11. The composition according to claim 10, wherein the acid flux is selected from the group consisting of a versatic acid, capric acid, caprylic acid, lauric acid, stearic acid and palmitic acid.

12. A method of producing an electronic device, the method comprising:
   opposing an electrical component having a plurality of electrical terminations, each termination including a solder bump, and a component-carrying substrate having a plurality of electrical terminations corresponding to the terminations of the electrical component;

applying a thermally curable adhesive composition to a metal surface on at least one of the electrical component and the substrate;

bringing the electrical component and the substrate into contact at elevated temperature so as to solder the electrical component to the substrate while simultaneously achieving encapsulation of the electrical component and the substrate in the adhesive composition, wherein the thermally curable adhesive composition comprises (A) a compound selected from the group consisting of (i) a thermosetting polymer, and (ii) a monomer which is polymerizable to yield a thermosetting polymer, wherein the thermosetting polymer (i) and the thermosetting polymer yielded by polymerization of the monomer (ii) are crosslinkable when subject to the action of a chemical crosslinking agent; and (B) a chemical crosslinking agent selected from the group consisting of (i) polyacids, (ii) polyanhydrides, and (iii) hydrazides, wherein the crosslinking agent has fluxing properties, is a solid at ambient temperature, and is insoluble in the thermally curable adhesive composition until heated to a soldering temperature; and wherein the composition is thermally curable when heated to the soldering temperatures.

\* \* \* \* \*